United States Patent
Yamashita

(10) Patent No.: US 7,358,509 B2
(45) Date of Patent: Apr. 15, 2008

(54) ION IMPLANTER, AND ANGLE MEASUREMENT APPARATUS AND BEAM DIVERGENCE MEASUREMENT APPARATUS FOR ION IMPLANTER

(75) Inventor: Takatoshi Yamashita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 260 days.

(21) Appl. No.: 11/330,234

(22) Filed: Jan. 12, 2006

(65) Prior Publication Data
US 2006/0192142 A1 Aug. 31, 2006

(30) Foreign Application Priority Data
Jan. 17, 2005 (JP) ............ P.2005-009078

(51) Int. Cl.
H01J 37/317 (2006.01)
H01J 37/22 (2006.01)
H01L 21/265 (2006.01)

(52) U.S. Cl. .................. 250/492.21; 250/397
(58) Field of Classification Search ........ 250/492.21, 250/397
See application file for complete search history.

(56) References Cited

U.S. PATENT DOCUMENTS 6,791,094 B1 * 9/2004 Olson et al. .......... 250/397
2005/0218345 A1 * 10/2005 Shibata .............. 250/492.21
2007/0120074 A1 * 5/2007 Rathmell et al. ...... 250/492.21

FOREIGN PATENT DOCUMENTS

| JP | A-59-046749 | 3/1984 |
|----|-------------|--------|
| JP | 62272447 | 11/1987 |
| JP | A-03-043997 | 2/1991 |
| JP | 7029535 | 1/1995 |
| JP | 2001-143651 | 5/2001 |
| JP | A-2001-229873 | 8/2001 |
| JP | A-2001-516151 | 9/2001 |
| JP | 2001326170 | 11/2001 |
| JP | A-2002-038274 | 2/2002 |
| JP | A-2002-288634 | 10/2002 |
| JP | A-2003-319169 | 11/2003 |
| JP | A-2004-511880 | 4/2004 |

OTHER PUBLICATIONS

Search Report Under Section 17(5); The Patent Office, May 9, 2006; 1 page.
Japanese Notification of Reasons for Refusal (8 pages) and Decision of Refusal (1 page); Patent application 2005-009078—Patent Examination First Department.

* cited by examiner

*Primary Examiner*—Jack I. Berman
(74) *Attorney, Agent, or Firm*—Finnegan, Henderson, Farabow, Garrett & Dunner, L.L.P.

(57) ABSTRACT

An apparatus is provided which is capable of measuring an angle between a holder and an ion beam without generating particles, with a simple structure, in a short time and at high accuracy even during an implantation state. An angle measurement apparatus is configured to: measure an angle of the ion beam by measuring beam plasma produced and emitting light when the ion beam collides with residual gas, with two cameras at two positions in a beam traveling direction; measure an angle of the holder by measuring light from a linear light source provided on the holder; and thereby measure the angle between the ion beam and the holder.

20 Claims, 4 Drawing Sheets

ION IMPLANTER, AND ANGLE MEASUREMENT APPARATUS AND BEAM DIVERGENCE MEASUREMENT APPARATUS FOR ION IMPLANTER

This application claims foreign priority based on Japanese Patent application No. 2005-009078, filed Jan. 17, 2005, the contents of which is incorporated herein by reference in its entirety.

BACKGROUND OF THE INVENTION

1. Field of the Invention

The present invention relates to an angle measurement apparatus for measuring an angle between a holder holding a substrate and an ion beam, and an actual implantation angle of the ion beam, etc., the angle measurement apparatus being used for an ion implanter. The present invention also relates to the ion implanter having the angle measurement apparatus, and a beam divergence measurement apparatus for measuring a divergence of the ion beam.

2. Description of the Related Art

A related art ion implanter, for example, as described in JP-A-2001-143651 (paragraphs 0002-0007, FIG. 5), uses a front Faraday unit (multipoint Faraday cup) capable of being elevated and lowered, the Faraday unit being arranged on an upstream side of a holder holding a substrate, and also uses a back Faraday unit (multipoint Faraday cup) which is arranged on a downstream side of the holder, in order to measure an angle of an ion beam in a traveling direction. The front Faraday unit is elevated or lowered not only for the measurement using the front Faraday unit, but also so as not to become an obstacle during an ion implantation into a substrate or measurement by the back faraday unit.

On the other hand, an angle of the holder has been measured with an encoder coupled to the holder.

In some related art examples, there are following problems:

(1) An ion beam is projected onto a Faraday cup and an angle of the ion beam is measured. Thus, particles (contaminants) are produced from the Faraday cup during the measurement, which is likely to contaminate a substrate.

(2) An elevating Faraday cup is used. Thus, the Faraday cup has a complicated structure, and the measurement takes long time since the elevation of the Faraday cup requires time.

(3) An angle of a holder and an angle of the ion beam are measured, not being correlated with each other. Thus, an angle between the holder and the ion beam can not be measured accurately.

(4) In an ion implantation state where the ion implantation into a substrate is performed, the front Faraday unit has to be removed from a beam line, as mentioned earlier. Thus, it is not possible to measure the ion beam in the ion implantation state with the front Faraday unit.

SUMMARY OF THE INVENTION

An object of the invention is to provide an apparatus capable of measuring an angle between a holder and an ion beam at high accuracy, without generating particles, with a simple structure and in a short time even during an ion implantation state. Another object of the invention is to provide an apparatus capable of measuring an actual implantation angle of the ion beam. Further object of the invention is to provide an apparatus capable of obtaining a divergence of the ion beam.

One or more embodiments of the invention provide, to put it briefly, an apparatus which measures an angle between the holder and the ion beam by measuring beam plasma with cameras installed at two positions in a beam traveling direction, the beam plasma being produced when the ion beam collides with residual gas and emitting light, and then by measuring light from a linear light source that is provided on the holder, with a camera.

In particular, one or more embodiments of the invention provide an angle measurement apparatus used for an ion implanter that irradiates an ion beam onto a substrate held by a holder in a vacuum chamber in which an angle of the holder with respect to the ion beam is variable, the angle measurement apparatus comprising:

a first camera and a second camera which measure luminance distribution of beam plasma at two positions in a traveling direction of the ion beam, and respectively output image data corresponding to the measured luminance distribution, the beam plasma being produced when the ion beam collides with residual gas and emitting light;

a linear light source arranged on the holder in a state that it is substantially in parallel with a substrate holding surface of the holder;

a third camera which measures light emitted from the linear light source and outputs image data corresponding to the measured light;

a first image data processor which processes the image data from the first camera and obtains a centroid ($P_1$) of a first area of the luminance distribution of the beam plasma;

a second image data processor which processes the image data from the second camera and obtains a centroid ($P_2$) of a second area of the luminance distribution of the beam plasma;

a third image data processor which processes the image data from the third camera and obtains a parallel line ($L_1$) that is parallel to the linear light source; and a deviation angle computing unit for obtaining a difference between a measurement angle ($\alpha_1$) and a reference angle ($\alpha$) as a deviation angle ($\theta$), the measurement angle ($\alpha_1$) being formed by the parallel line ($L_1$) and a line connecting the centroid ($P_1$) of the first area and the centroid ($P_2$) of the second area when the angle of the holder with respect to the ion beam is set to the reference angle ($\alpha$).

The line ($L_2$) connecting the centroid of the first area and the centroid of the second area obtained by processing the image data from the first camera and the second camera represents a precise actual traveling direction of the ion beam. The angle measurement apparatus can measure the line ($L_2$) without generating particles, with a simple structure, in a short time and at high accuracy even during the implantation state, unlike a case where a Faraday cup is used.

Moreover, the parallel line ($L_1$) parallel to the linear light source obtained by processing the image data from the third camera represents a precise actual orientation of the holder (to be more specific, its substrate holding surface). The angle measurement apparatus can measure the parallel line ($L_1$) without generating particles, with a simple structure, in a short time and at high accuracy even during the implantation state.

Moreover, the measurement angle ($\alpha_1$) represents an actual angle between the holder and the ion beam precisely. The angle measurement apparatus can measure the deviation angle ($\theta$) which is a difference between the measurement angle ($\alpha_1$) and the reference angle ($\alpha$) being set to the holder, without generating particles, with a simple structure, in a short time and at high accuracy even during the implantation state.

The reference angle (α) may be set to 0 degrees, or the implantation state, that is, an angle obtained by subtracting a set implantation angle (Φ) of the ion beam with respect to the substrate on the holder from 90 degrees.

According to the angle measurement apparatus of the invention, it is possible to measure the deviation angle (θ) in the state where the holder is laid in the substrate transfer state.

According to the angle measurement apparatus of the invention, it is possible to measure the deviation angle (θ) in the state where the holder stands in the actual implantation state.

The angle measurement apparatus may further comprise an implantation angle computing unit for obtaining an actual implantation angle ($\Phi_1$) of the ion beam with respect to the substrate on the holder by using a set implantation angle (Φ) of the ion beam with respect to the substrate on the holder and the deviation angle (θ).

Accordingly, it is possible to measure the actual implantation angle ($\Phi_1$) of the ion beam with respect to the substrate on the holder without generating particles, with a simple structure, in a short time and at high accuracy even during the implantation state.

One or more embodiments of the invention provide an ion implanter comprising: the angle measurement apparatus; and a correction unit for correcting the reference angle (α) so that the deviation angle (θ) approaches 0, a correction unit for correcting the traveling direction of the ion beam so that the deviation angle (θ) approaches 0, or a correction unit for setting the angle of the holder at the time of the ion implantation based on the deviation angle (θ).

According to the ion implanter, it is possible to compensate for the deviation angle (θ) by the correction unit and perform ion implantation into the substrate on the holder at the precise implantation angle.

One or more embodiments of the invention provide an angle measurement apparatus comprising an implantation angle computing unit, instead of the deviation angle computing unit of the above described angle measurement apparatus, for obtaining an actual implantation angle ($\Phi_1$) being formed by a perpendicular line ($L_3$) of the parallel line ($L_1$) and a line ($L_2$) connecting the first area centroid and the second area centroid when an implantation angle of the ion beam with respect to the substrate on the holder is set to a predetermined implantation angle (Φ).

According to the angle measurement apparatus, it is possible to directly measure the actual implantation angle ($\Phi_1$) of the ion beam with respect to the substrate on the holder without obtaining the deviation angle (θ), without generating particles, with a simple structure, in a short time and at high accuracy.

One or more embodiments of the invention provide a beam divergence measurement apparatus used for an ion implanter that irradiates an ion beam onto a substrate held by a holder in a vacuum chamber, the beam divergence measurement apparatus comprising:

a first camera and a second camera which measure luminance distribution of beam plasma at two positions in a traveling direction of the ion beam, and respectively output image data corresponding to the measured luminance distribution, the beam plasma being produced when the ion beam collides with residual gas and emitting light;

a first image data processor which processes the image data from the first camera and obtains a first width ($W_1$) at a predetermined threshold value of the luminance distribution of the beam plasma;

a second image data processor which processes the image data from the second camera and obtains a second width ($W_2$) at the predetermined threshold value of the luminance distribution of the beam plasma; and a divergence computing unit for obtaining a divergence of the ion beam based on a difference between the first width and the second width.

According to the beam divergence measurement apparatus, it is possible to measure the divergence of the ion beam without generating particles, with a simple structure, in a short time and at high accuracy even during the implantation state, unlike the case where the Faraday cup is used.

In the angle measurement apparatus of the invention, peak points of the luminance distribution of the beam plasma may be used instead of the centroid of the first area and the centroid of the second area.

According to the angle measurement apparatus of the invention, when the peak points of the luminance distribution of the beam plasma are used, the same advantage can be obtained as the case where the centroids of the areas of the luminance distribution of the beam plasma are obtained.

In the angle measurement apparatus and the divergence measurement apparatus of the invention, a single image data process or may be used as a plurality of the image data processors.

According to the angle measurement apparatus and the beam divergence measurement apparatus of the invention, as a single image data processor is used as a plurality of the image data processors, the system configuration can be simplified.

In the angle measurement apparatus and the divergence measurement apparatus of the invention, a single camera may be used as a plurality of the cameras.

According to the angle measurement apparatus and the beam divergence measurement apparatus of the invention, as a single camera is used as a plurality of the cameras, the system configuration can be simplified.

In the angle measurement apparatus and the divergence measurement apparatus of the invention, the camera is preferably a CCD (Charge Coupled Device) camera.

According to the angle measurement apparatus and the beam divergence measurement apparatus of the invention, as a CCD camera is generally more compact and has higher sensitivity than other types of cameras, the measurement apparatus can be downsized and the luminance distribution of the beam plasma can be measured at a higher accuracy, thus enhancing the measurement accuracy.

DESCRIPTION OF THE PREFERRED EMBODIMENTS

Figure 1:
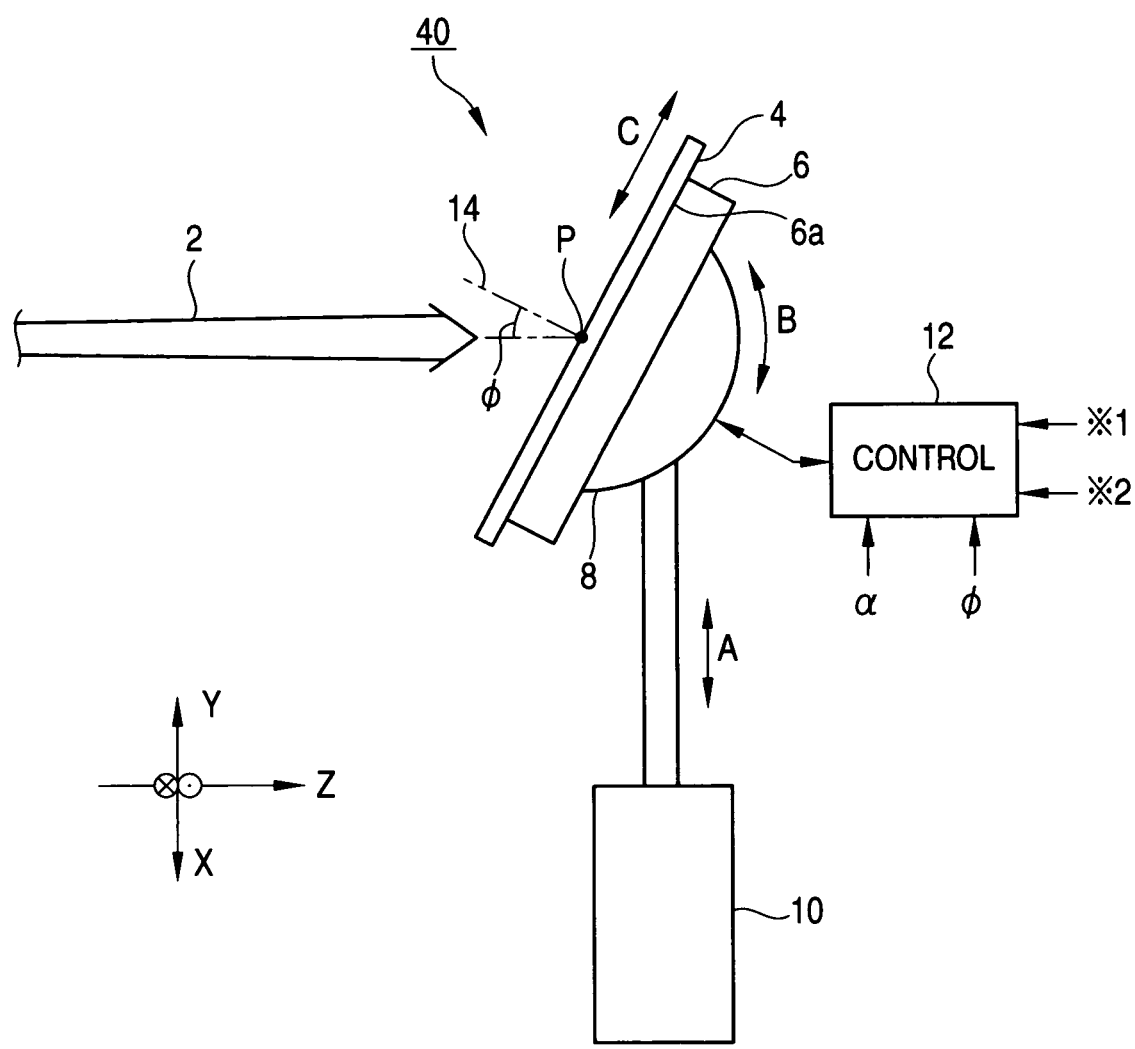
FIG. 1 is an exemplary side view of a holder and its surroundings of an ion implanter to which a measurement apparatus according to the invention is applicable.

FIG. 1 is an exemplary side view of a holder and its surroundings of an ion implanter to which a measurement apparatus according to the invention is applicable. An ion implanter 40 is arranged to irradiate an ion beam 2 onto a substrate 4 (for example a semiconductor substrate) which is held by a holder 6 for holding a substrate, so as to perform an ion implantation into the substrate 4, in a vacuum chamber (not shown).

In this example, assuming that three directions orthogonal to each other at one point are X, Y and Z directions, the ion beam 2 travels in the Z direction and projects onto the substrate 4, while a scanner (not shown) performs scanning with the ion beam 2 reciprocating in the X direction. The holder 6 and the substrate 4 thereon are mechanically driven up and down in the Y direction by a holder driving device 10 as shown by an arrow A. The ion beam 2 is thus irradiated onto the entire surface of the substrate 4, and the ion implantation is performed. In this example, the X and Z directions are horizontal directions while the Y direction is vertical direction.

The ion implanter 40 further includes a holder angle control motor 8 and a controller 12. The holder angle control motor 8 rotates the holder 6 between a state where the holder 6 stands upright in the vertical direction and a state where the holder 6 lies in the horizontal direction as shown by an arrow B, in order to change (control) the angle of the holder 6 (to be more precise, the angle of its substrate holding surface 6a, the same hereinafter). The controller 12 controls the holder angle control motor 8 to control the angle of the holder 6. Data of the angle of the holder 6 is fed back to the controller 12 from an encoder (not shown) which is coupled to the holder 6. A center of the rotation of the holder 6 is generally assumed as a point P on a surface of the substrate 4 that is held by the holder 6. As the substrate 4 is attached to the holder 6, the angle of the holder 6 is generally the same as that of the substrate 4.

An angle Φ (angle in the Y-Z plane) between a perpendicular line 14 on the surface of the substrate 4 and the traveling direction Z of the ion beam 2 is called an implantation angle. In this example, it is possible to change the implantation angle Φ with respect to the substrate 4 during the ion implantation, by rotating the holder 6 with the holder angle control motor 8 as described above. Transfer (delivery) of the substrate 4 onto the holder 6 is performed in a state where the holder 6 is laid horizontally by the holder control motor 8.

In the controller 12, the implantation angle Φ and a reference angle α which will be described later are set as required. Also, a deviation angle θ and an actual implantation angle $\Phi_1$ which will be described later are input to the controller 12.

As shown by an arrow C, the holder 6 may be driven up and down in a direction parallel to the substrate holding surface 6a instead of being driven up and down in the Y direction as described above.

An angle between the ion beam 2 and the holder 6 or the substrate 4, for example the implantation angle Φ, is an important parameter in the ion implantation and needs to be controlled accurately. For that purpose, it is necessary to measure the angle at high accuracy. An embodiment of an angle measurement apparatus and the like for measuring the angle and the related angles will be described in the following.

Figure 2:
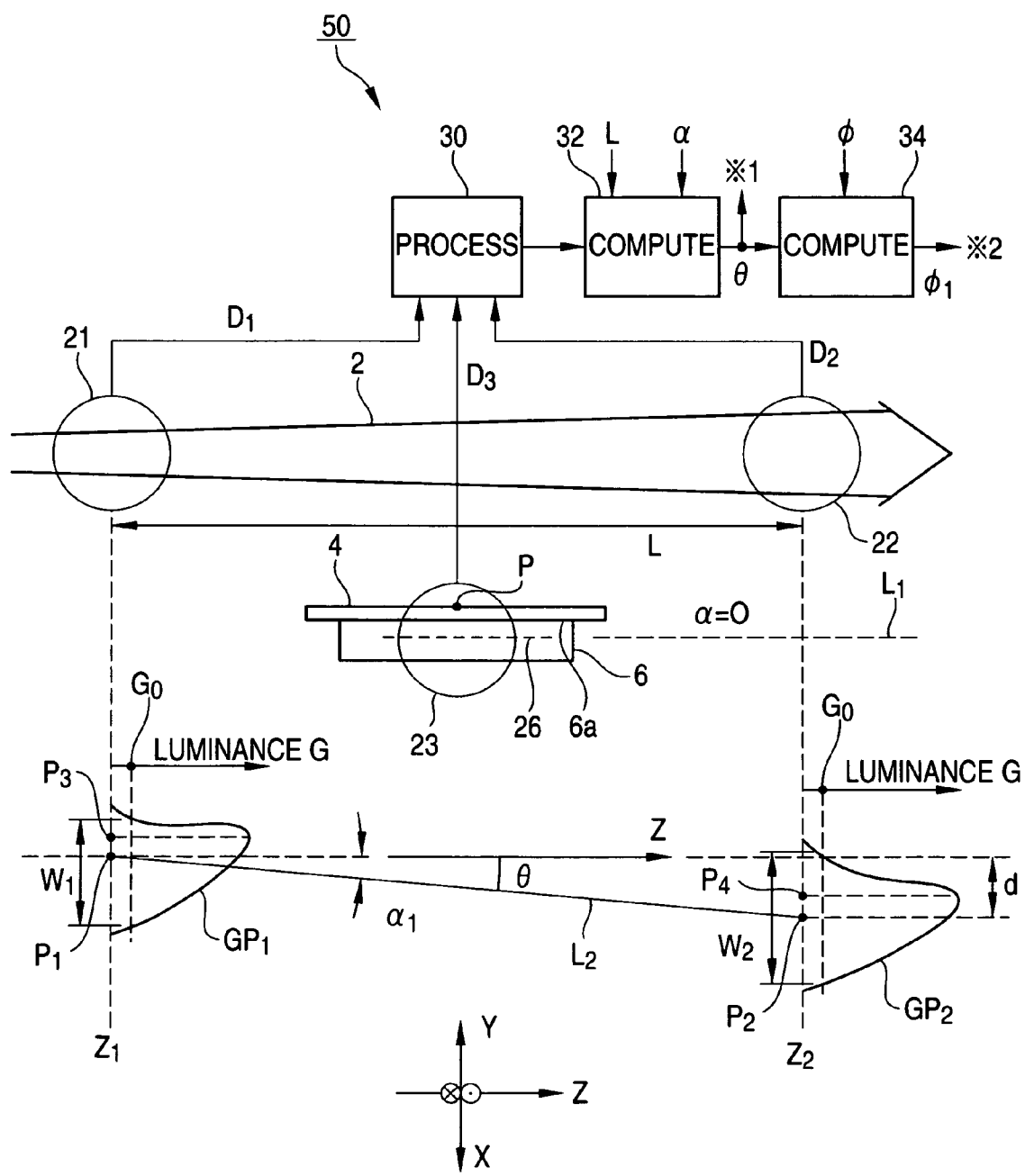
FIG. 2 is a side view of an angle measurement apparatus according to an embodiment of the invention, and shows a state where a reference angle of a holder is set to 0 degrees.
Figure 3:
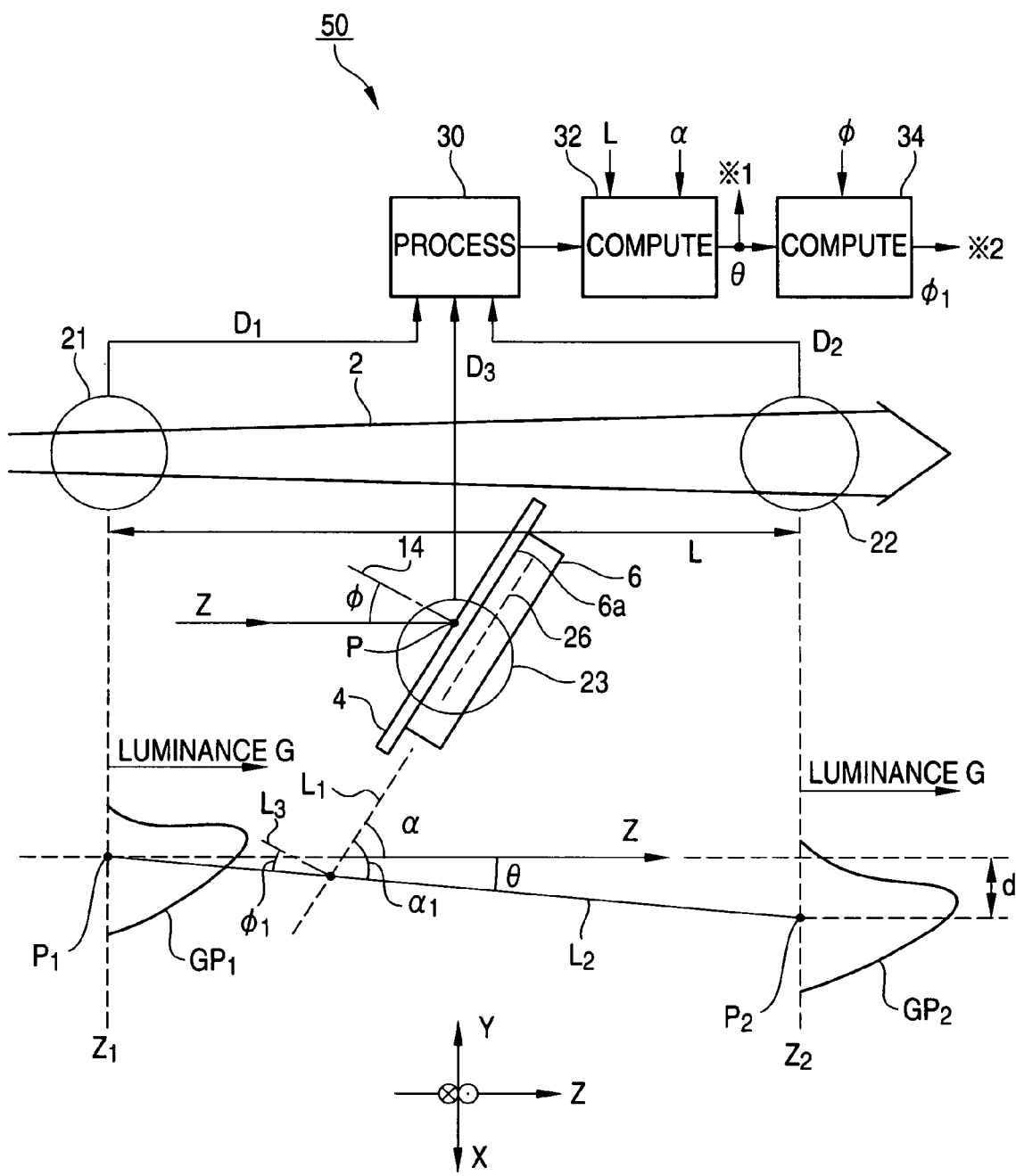
FIG. 3 is a side view of an angle measurement apparatus according to an embodiment of the invention, and shows a state where a reference angle of a holder is set to an implantation state.

FIG. 2 is a side view of an angle measurement apparatus and the like according to an embodiment of the invention, and shows a state where the reference angle of the holder is set to 0 degrees. This state is an example of a transfer state where the substrate 4 is transferred to the holder 6, while the holder 6 is laid in the horizontal state and lowered in the Y direction by the holder driving device 10 shown in FIG. 1. FIG. 3 is a side view of an angle measurement apparatus and the like according to an embodiment of the invention, and shows a state where the reference angle of the holder is set to an implantation state. This state is an example of an implantation state where the holder 6 stands at a predetermined implantation angle Φ and the ion implantation to the substrate 4 is performed.

Each device according to the invention, to put it briefly, measures beam plasma which is produced when the ion beam 2 collides with residual gas existing on a path of the ion beam 2, and emits light, by using cameras 21, 22 at two positions $Z_1$, $Z_2$ in the beam traveling direction Z, so as to measure the angle of the ion beam 2 in the Y-Z plane. Moreover, each device according to the invention measures light from a linear light source 26 which is provided in the holder 6 by using a camera 23, so as to measure the angle of the holder 6 in the Y-Z plane. Light emission intensity of the beam plasma depends on a beam current density of the ion beam 2 and a residual gas pressure.

When the angle of the ion beam 2 is measured, the scanning with the ion beam 2 in the X direction is preferably halted. As the cameras 21-23 measure light emission from the beam plasma and the linear light source 26, the measurement is preferably performed in an environment where external light is shut off, for example, in the vacuum chamber with no external light coming therein.

An angle measurement apparatus 50 shown in FIGS. 2 and 3 is arranged in the vicinity of the side face (rear face or front face of the paper) of the path in the traveling direction Z of the ion beam 2. The angle measurement apparatus 50 includes the first camera 21 and the second camera 22 which measures a luminance distribution $GP_1$, $GP_2$ respectively at the two positions $Z_1$, $Z_2$ in the traveling direction Z of the ion beam 2, and outputs image data $D_1$, $D_2$ respectively. Each of the luminance distribution $GP_1$, $GP_2$ is a distribution of luminance G in the Y-Z plane, of the beam plasma (represented and shown as the ion beam 2 in FIG. 2 and after) that is produced when the ion beam 2 collides with the residual gas and emits light.

The angle measurement apparatus 50 further includes the linear light source 26 in the holder 6, and the third camera 23. The linear light source 26 is arranged substantially in parallel with its substrate holding surface 6a. The third camera 23 is provided on the side face (rear face or front face of the paper) of the substrate 4 in a position of the transfer state, measures the light emitted from the linear light source 26 in the Y-Z plane, and outputs the corresponding image data $D_3$. Preferably, the linear light source 26 is linear in the Y-Z plane.

Figure 4:
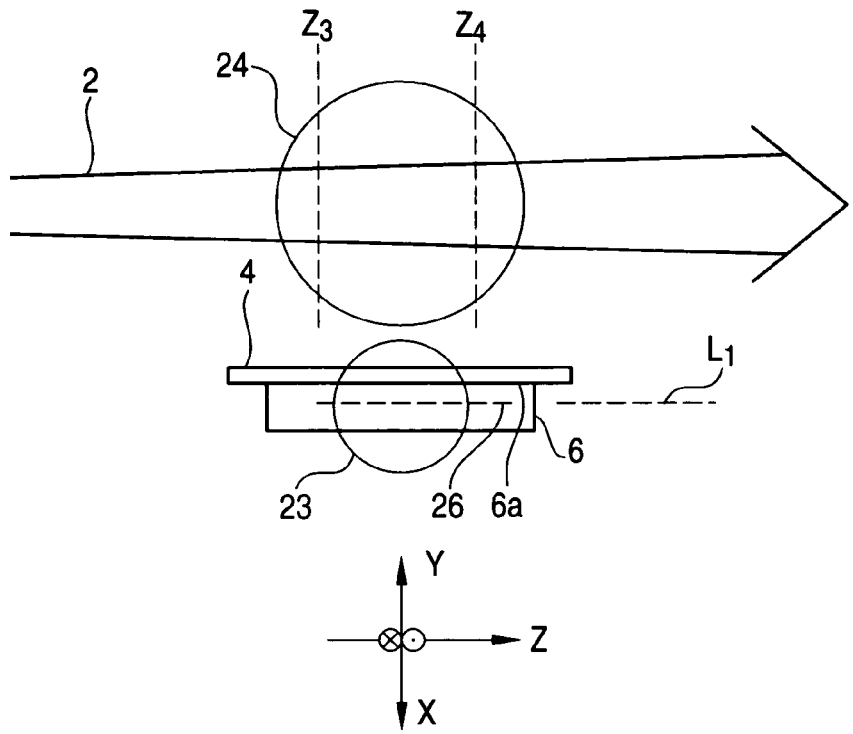
FIG. 4 is a side view showing an embodiment in which two cameras are used.
Figure 5:
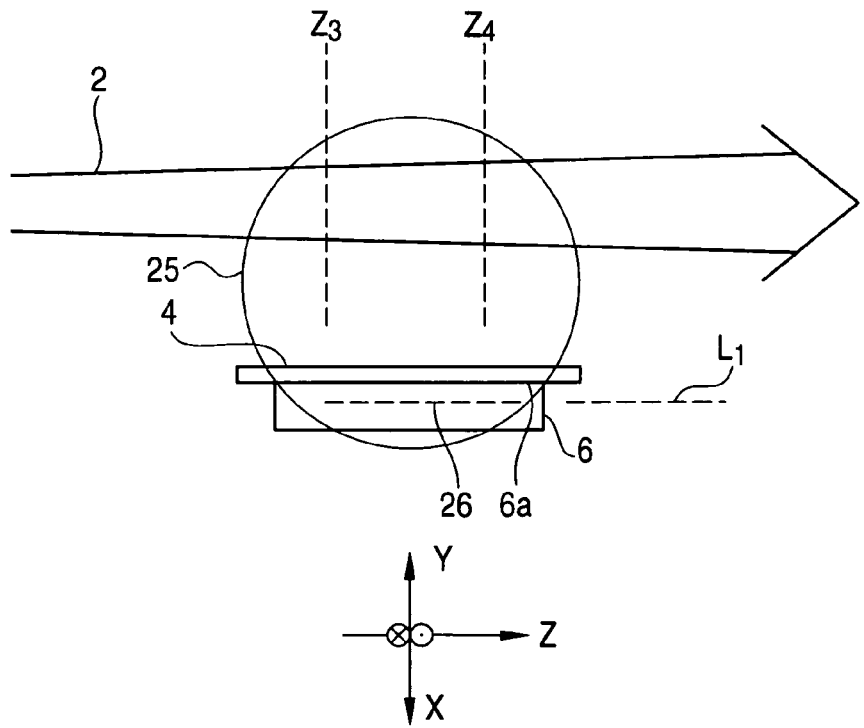
FIG. 5 is a side view showing an embodiment in which a single camera is used.

The three cameras 21-23 are preferably set in predetermined precise positions, thereby reducing measurement errors of the measurement. Positional data of each of the cameras 21-23 are previously given to an image data processor 30 which will be described later. The same applies to cameras 24, 25 which are shown in FIGS. 4, 5.

For each of the three cameras 21-23, preferably a CCD (Charge Coupled Device) camera is used. Generally, the CCD camera is more compact and has higher sensitivity than other types of cameras. Thus, the measurement device can be downsized, and can measure the luminance distribution of the beam plasma with high accuracy, there by enhancing the measurement accuracy. The same applies to the cameras 24, 25 shown in FIGS. 4, 5.

The angle measurement apparatus 50 further includes the image data processor 30 for processing the image data $D_1$-$D_3$ from the three cameras 21-23, and a deviation angle computing unit 32 for obtaining the deviation angle θ, which will be described later, based on the data from the image data processor 30.

In this example, the single image data processor 30 is used as a first image data processor, a second image data processor and a third image data processor. The first image data processor processes the image data $D_1$ from the first camera 21, and obtains a position of a centroid $P_1$ of an area (a first area centroid) of the luminance distribution $GP_1$ of the beam plasma. The second image data processor processes the image data $D_2$ from the second camera 22, and obtains a position of a centroid $P_2$ of an area (a second area centroid) of the luminance distribution $GP_2$ of the beam plasma. The third image data processor processes the image data $D_3$ from the third camera 23, and obtains a parallel line $L_1$ which is parallel to the linear light source 26. As the single image data processor 30 is used as the three image data processors, a system configuration is simplified. Also in other embodiments which will be described later, a single image data processor may be used as a plurality of image data processors.

In this example, the deviation angle computing unit 32 obtains the deviation angle θ as a difference between a measurement angle $α_1$ and the reference angle α, when the angle of the holder 6 (to be more specific, the angle of the substrate holding surface 6a with respect to the ion beam traveling direction Z, the same hereinafter) is set to the predetermined reference angle α. The deviation angle computing unit 32 obtains the deviation angle θ by using the first area centroid $P_1$, the second area centroid $P_2$ and the parallel line $L_1$, which are obtained by the image data processor 30. The measurement angle $α_1$ is formed by a parallel line $L_1$ and a line $L_2$ connecting the first area centroid $P_1$ and the second area centroid $P_2$.

Referring to FIG. 3, it is easy to understand about the reference angle α. However, FIG. 2 shows an example of the state where the reference angle α is set to 0 degrees. In this example, the parallel line $L_1$ and the ion beam traveling direction Z are parallel to each other. Thus, the measurement angle $α_1$ directly represents a deviation angle θ. The deviation angle θ can be calculated by using an expression 1. In the expression 1, L represents a distance between the cameras 21 and 22 (to be more specific, between the positions $Z_1$, $Z_2$) in the ion beam traveling direction Z, and d represents a distance between the area centroids $P_1$, $P_2$ in the Y direction. The reference angle α and the distance L are set in the deviation angle computing unit 32.

$$θ=\tan^{-1}(d/L)$$ [Expression 1]

FIG. 3 shows an example of the state where the reference angle α is set to greater than 0 degrees. To be more specific, FIG. 3 shows a case where the angle of the holder 6 is set to a predetermined implantation angle Φ, and both angles have a relationship of an expression 2. However, the reference angle α may be any other angle.

$$α=90-Φ \text{ (degrees)}$$ [Expression 2]

Also in the case of FIG. 3, the deviation angle computing unit 32 measures the measurement angle $α_1$ formed by the parallel line $L_1$ and the line $L_2$ based on the data from the image data processor 30, and can calculate the deviation angle θ by using an expression 3. FIG. 2 shows a case where α is 0 degrees in the expression 3.

$$θ=α_1-α$$ [Expression 3]

In this way, the angle measurement apparatus 50 can obtain the deviation angle θ with respect to the arbitrary reference angle α. The data of the deviation angle θ and the reference angle α are given to the controller 12.

The line $L_2$ represents the precise traveling direction of the ion beam 2. The parallel line $L_1$ precisely represents an orientation of the holder 6. The measurement angle $α_1$ precisely represents the actual angle between the holder 6 and the ion beam 2. The angle measurement apparatus 50 can measure the parallel line $L_1$, the line $L_2$, the measurement angle $α_1$, and the deviation angle θ without generating particles, with a simple structure, in a short time since time for elevating the Faraday cup is not required unlike the related art, and at high accuracy, unlike the related art case where the Faraday cup is used. Furthermore, the reference angle α can be set to the implantation state as shown in FIG. 3, so that high-accuracy measurement is possible even during the implantation state.

In the angle control of the holder angle control motor 8 and the holder 6 by the controller 12, the substrate transfer state (normally in horizontal state) of the holder 6 is often assumed as an initial state. Performing the measurement with the reference angle α set to 0 degrees, the deviation angle θ in the initial state can be measured. Accordingly, it is possible to correct the deviation angle θ in the initial state easily.

When the measurement is performed with the reference angle α set to an angle satisfying the expression 2, that is, the implantation angle Φ, the deviation angle θ in the state where the holder 6 stands in the actual implantation state can be measured. It is thus possible to measure the deviation angle θ in the actual implantation state more accurately.

The angle measurement apparatus 50 according to this embodiment further includes an implantation angle computing unit 34. The implantation angle computing unit 34 calculates the actual (real) implantation angle $Φ_1$ of the ion beam 2 with respect to the substrate 4 on the holder 6, by using the implantation angle $Φ_1$ set for the holder 6 (to be specific, for the controller 12) and deviation angle θ that is obtained as described above. The implantation angle computing unit 34 obtains the actual implantation angle $Φ_1$ by using an expression 4.

$$Φ_1=Φ-θ$$ [Expression 4]

As a result, it is possible to measure the actual implantation angle $Φ_1$ of the ion beam 2 with respect to the substrate 4 on the holder 6 without generating particles, with a simple structure, in a short time, and at high accuracy even during the implantation state. In this example, the data of the actual implantation angle $Φ_1$ is also given to the controller 12.

In the image data processor 30, positions of peak points $P_3$, $P_4$ (refer to FIG. 2) of the luminance distribution $GP_1$, $GP_2$ of the beam plasma may be obtained respectively instead of the area centroids $P_1$, $P_2$. Then, the measurement may be performed by using the peak points $P_3$, $P_4$ rather than the area centroids $P_1$, $P_2$. Also in this case, the same effect is obtained as the case where the area centroids $P_1$, $P_2$ are obtained.

A single camera may be used as two or three of the first, the second and the third cameras. This simplifies the system configuration. The same applies to other embodiments described later.

FIG. 4 shows a case where a single camera 24 is used as the first and the second cameras. In this case, the camera 24 measures the luminance distribution of the beam plasma respectively at two positions $Z_3$, $Z_4$ in the beam traveling direction within a field of view of the camera 24, and gives the image data to the image data processor 30. Subsequent processes are the same as those mentioned above. In this case, the camera 24 may be a wide angle camera as required. This also applies to a camera 25 shown in FIG. 5.

FIG. 5 shows a case where the single camera 25 is used as the first, the second and the third cameras. Measurement of the luminance distribution of the beam plasma is the same as that in FIG. 4. In this example, the camera 25 measures the light emitted from the linear light source 26, and gives the image data to the image data processor 30. Subsequent processes are the same as those mentioned above. In this case, the holder 6 in the measurement position and the ion beam 2 may be brought closer to each other as required.

The ion implanter may be configured to further include, in addition to the angle measurement apparatus 50, a correction unit for correcting the reference angle α of the holder 6 so that the deviation angle θ approaches 0. For example, the ion implanter 40 as shown in FIG. 1 may include, together with the angle measurement apparatus 50, the correction unit provided in the controller 12.

Furthermore, the ion implanter may be configured to further include, in addition to the angle measurement apparatus 50, a correction unit for correcting the traveling direction Z of the ion beam 2 so that the deviation angle θ approaches 0. For example, the ion implanter 40 as shown in FIG. 1 may include, together with the angle measurement apparatus 50, a deflecting unit for deflecting the ion beam toward the Y direction to correct the deviation angle θ, the deflecting unit being provided as the correction unit. An ion implanter generally includes a deflecting unit for deflecting the ion beam 2 toward the Y direction to separate neutral particles. Thus, this deflecting unit may be used as the deflecting unit for correcting the deviation angle θ.

Furthermore, the ion implanter may be configured to further include, in addition to the angle measurement apparatus 50, a correction unit for setting the angle of the holder 6 at the time of the ion implantation while considering the deviation angle θ, instead of correcting the deviation angle θ to 0. For example, the ion implanter 40 as shown in FIG. 1 may include, together with the angle measurement apparatus 50, the correction unit provided in the controller 12. The correction unit gives an implantation angle $\Phi_2$ to the holder angle control motor 8 by an expression 5, for example.

$$\Phi_2 = \Phi + \theta \qquad \text{[Expression 5]}$$

Then, the implantation angle $\Phi_2$ is set to the holder angle control motor 8 instead of the implantation angle Φ in the expression 4. Thus, the actual implantation angle $\Phi_1$ is calculated by using an expression 6, and the deviation angle θ is compensated (canceled). Accordingly, it is possible to precisely implement the implantation angle Φ that a user has set to the controller 12.

$$\Phi_1 = (\Phi + \theta) - \theta \qquad \text{[Expression 6]}$$

-continued $$= \Phi$$

For any one of the ion implanters as described above, it is possible to compensate for the deviation angle θ by the correction unit and perform the ion implantation into the substrate 4 on the holder 6 at the precise implantation angle.

In another embodiment of the angle measurement apparatus, an implantation angle computing unit 34 having the following functions may be connected to the image data processor 30, without the deviation angle computing unit 32 being provided in the angle measurement apparatus.

The implantation angle computing unit 34 in this embodiment obtains the actual implantation angle $\Phi_1$, which is an angle formed by a perpendicular line $L_3$ with respect to the parallel line $L_1$, and the line $L_2$ connecting the area centroid $P_1$ and the area centroid $P_2$, when the implantation angle of the ion beam with respect to the substrate 4 on the holder 6 is set to the predetermined implantation angle Φ, as referred to FIG. 3. The implantation angle computing unit 34 obtains the actual implantation angle $\Phi_1$ by using the area centroid $P_1$, the area centroid $P_2$ and the parallel line $L_1$ that are obtained as described above by the image data processor 30.

According to the angle measurement apparatus, it is possible to measure the actual implantation angle $\Phi_1$ of the ion beam with respect to the substrate 4 on the holder 6, directly without obtaining the deviation angle θ, without generating particles, with a simple structure, in a short time and at high accuracy.

By using the cameras 21, 22, a beam divergence measurement apparatus may be provided. In this case, the angle of the holder 6 needs not necessarily be variable.

The beam divergence measurement apparatus, referring to FIG. 2, includes the first and the second cameras 21, 22, a first image data processor, a second image data processor and a divergence computing unit. The first image data processor processes the image data $D_1$ from the camera 21, and obtains a first width $W_1$ in the Y direction at a predetermined threshold value $G_0$ of the luminance distribution $GP_1$ of the beam plasma. The second image data processor processes the image data $D_2$ from the camera 22, and obtains a second width $W_2$ in the Y direction at the same threshold value $G_0$ of the luminance distribution $GP_2$ of the beam plasma. The divergence computing unit obtains a difference between the first width $W_1$ and the second width $W_2$ obtained by the first and the second image data processors, and obtains the divergence of the ion beam 2.

In this case, a single image data processor, for example the image data processor 30, may be used as the first and the second image data processors. The divergence computing unit may be provided instead of the deviation angle computing unit 32 and the implantation angle computing unit 34.

The predetermined threshold value $G_0$ may be 0 or a value greater than 0. The divergence may be obtained from the calculation $W_2-W_1$ or $|W_2-W_1|$. The divergence may be obtained from the calculation $(W_2-W_1)/L$ or $|W_2-W_1|/L$ as a divergence per unit length.

As same as the angle measurement apparatus 50, a single camera may be used as the first and the second cameras, and the camera is preferably a CCD camera.

According to the divergence measurement apparatus, it is possible to measure the divergence of ion beam 2 without generating particles, with a simple structure, in a short time and at high accuracy even during the implantation state, unlike the case using the Faraday cup.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. An angle measurement apparatus used for an ion implanter, said ion implanter irradiating an ion beam onto a substrate in a vacuum chamber, said substrate being held by a holder whose angle with respect to the ion beam is variable, said angle measurement apparatus comprising:
    a first camera and a second camera which measure luminance distribution of beam plasma at two positions in a traveling direction of the ion beam, and respectively output image data corresponding to the measured luminance distribution, said beam plasma being produced when the ion beam collides with residual gas and emitting light;
    a linear light source arranged on the holder in a state that it is substantially in parallel with a substrate holding surface of the holder;
    a third camera which measures light emitted from the linear light source and outputs image data corresponding to the measured light;
    a first image data processor which processes the image data from the first camera and obtains a centroid of a first area of the luminance distribution of the beam plasma;
    a second image data processor which processes the image data from the second camera and obtains a centroid of a second area of the luminance distribution of the beam plasma;
    a third image data processor which processes the image data from the third camera and obtains a parallel line that is parallel to the linear light source; and
    a deviation angle computing unit for obtaining a difference between a measurement angle and a reference angle as a deviation angle, said measurement angle being formed by the parallel line and a line connecting the centroid of the first area and the centroid of the second area when the angle of the holder with respect to the ion beam is set to the reference angle.

2. The angle measurement apparatus according to claim 1, wherein the reference angle is set to 0 degrees.

3. The angle measurement apparatus according to claim 1, wherein the reference angle is set to an angle obtained by subtracting a set implantation angle of the ion beam with respect to the substrate from 90 degrees.

4. The angle measurement apparatus according to claim 1, further comprising:
    an implantation angle computing unit for obtaining an actual implantation angle of the ion beam with respect to the substrate by using a set implantation angle of the ion beam with respect to the substrate and the deviation angle.

5. The angle measurement apparatus according to claim 1, wherein the deviation angle computing unit uses peak points of the luminance distribution of the beam plasma instead of the centroid of the first area and the centroid of the second area.

6. The angle measurement apparatus according to claim 1, wherein a single image data processor is used as any two or three of the first image data processor, the second image data processor and the third image data processor.

7. The angle measurement apparatus according to claim 1, wherein a single camera is used as any two or three of the first camera, the second camera and the third camera.

8. The angle measurement apparatus according to claim 1, wherein at least one of the first camera, the second camera and the third camera is a CCD (Charge Coupled Device) camera.

9. An ion implanter comprising:
    the angle measurement apparatus according to claim 1; and
    a correction unit for correcting the reference angle so that the deviation angle approaches 0.

10. An ion implanter comprising:
    the angle measurement apparatus according to claim 1; and
    a correction unit for correcting the traveling direction of the ion beam so that the deviation angle approaches 0.

11. An ion implanter comprising:
    the angle measurement apparatus according to claim 1; and
    a correction unit for setting the angle of the holder at the time of the ion implantation based on the deviation angle.

12. An angle measurement apparatus used for an ion implanter, said ion implanter irradiating an ion beam onto a substrate in a vacuum chamber, said substrate being held by a holder whose angle with respect to the ion beam is variable, said angle measurement apparatus comprising:
    a first camera and a second camera which measure luminance distribution of beam plasma at two positions in a traveling direction of the ion beam, and respectively output image data corresponding to the measured luminance distribution, said beam plasma being produced when the ion beam collides with residual gas and emitting light;
    a linear light source arranged on the holder in a state that it is substantially in parallel with a substrate holding surface of the holder;
    a third camera which measures light emitted from the linear light source and outputs image data corresponding to the measured light;
    a first image data processor which processes the image data from the first camera and obtains a centroid of a first area of the luminance distribution of the beam plasma;
    a second image data processor which processes the image data from the second camera and obtains a centroid of a second area of the luminance distribution of the beam plasma;
    a third image data processor which processes the image data from the third camera and obtains a parallel line that is parallel to the linear light source; and
    an implantation angle computing unit for obtaining an actual implantation angle being formed by a perpendicular line of the parallel line and a line connecting the centroid of the first area and the centroid of the second area when an implantation angle of the ion beam with respect to the substrate on the holder is set to a predetermined implantation angle.

13. The angle measurement apparatus according to claim 12, wherein the implantation angle computing unit uses peak points of the luminance distribution of the beam plasma instead of the centroid of the first area and the centroid of the second area.

14. The angle measurement apparatus according to claim 12, wherein a single image data processor is used as any two or three of the first image data processor, the second image data processor and the third image data processor.

15. The angle measurement apparatus according to claim 12, wherein a single camera is used as any two or three of the first camera, the second camera and the third camera.

16. The angle measurement apparatus according to claim 12, wherein at least one of the first camera, the second camera and the third camera is a CCD (Charge Coupled Device) camera.

17. A beam divergence measurement apparatus used for an ion implanter, said ion implanter irradiating an ion beam onto a substrate held by a holder in a vacuum chamber, said beam divergence measurement apparatus comprising:

a first camera and a second camera which measure luminance distribution of beam plasma at two positions in a traveling direction of the ion beam, and respectively output image data corresponding to the measured luminance distribution, said beam plasma being produced when the ion beam collides with residual gas and emitting light;

a first image data processor which processes the image data from the first camera and obtains a first width at a predetermined threshold value of the luminance distribution of the beam plasma;

a second image data processor which processes the image data from the second camera and obtains a second width at the predetermined threshold value of the luminance distribution of the beam plasma; and a divergence computing unit for obtaining a divergence of the ion beam based on a difference between the first width and the second width.

18. The beam divergence measurement apparatus according to claim 17, wherein a single image data processor is used as the first image data processor and the second image data processor.

19. The beam divergence measurement apparatus according to claim 17, wherein a single camera is used as the first camera and the second camera.

20. The beam divergence measurement apparatus according to claim 17, wherein at least one of the first camera and the second camera is a CCD (Charge Coupled Device) camera.

* * * * *